(12) United States Patent
Chan

(10) Patent No.: US 8,920,097 B2
(45) Date of Patent: Dec. 30, 2014

(54) WAFER HANDLING SYSTEM FOR A LOADLOCK

(75) Inventor: Soon Chye Chan, Johor Bahru (MY)

(73) Assignee: GLOBALFOUNDRIES Singapore Pte. Ltd., Singapore (SG)

(*) Notice: Subject to any disclaimer, the term of this patent is extended or adjusted under 35 U.S.C. 154(b) by 1272 days.

(21) Appl. No.: 11/933,810

(22) Filed: Nov. 1, 2007

(65) Prior Publication Data

US 2008/0107508 A1  May 8, 2008

Related U.S. Application Data

(60) Provisional application No. 60/864,148, filed on Nov. 2, 2006.

(51) Int. Cl.
  *H01L 21/677* (2006.01)
  *H01L 21/687* (2006.01)

(52) U.S. Cl.
  CPC .... *H01L 21/68707* (2013.01); *H01L 21/67766* (2013.01); *H01L 21/67781* (2013.01); *Y10S 414/136* (2013.01); *Y10S 414/141* (2013.01)
  USPC ............ 414/217; 414/936; 414/941; 414/805

(58) Field of Classification Search
  CPC .................. H01L 21/67201; H01L 21/67333; H01L 21/67336; H01L 21/67742; H01L 21/67745; H01L 21/67748; H01L 21/67769; H01L 21/67778; H01L 21/67781; H01L 21/68; H01L 21/683; H01L 21/68707
  USPC ............... 414/217, 217.1, 935, 936, 937, 941
  See application file for complete search history.

(56) References Cited

U.S. PATENT DOCUMENTS

| | | | | |
|---|---|---|---|---|
| 2,326,962 | A * | 8/1943 | Meier | 294/118 |
| 4,105,970 | A * | 8/1978 | Katz | 324/761 |
| 5,061,144 | A * | 10/1991 | Akimoto et al. | 414/222.02 |
| 5,586,585 | A * | 12/1996 | Bonora et al. | 141/93 |
| 5,613,821 | A * | 3/1997 | Muka et al. | 414/217.1 |
| 5,669,644 | A * | 9/1997 | Kaihotsu et al. | 294/213 |
| 5,909,994 | A * | 6/1999 | Blum et al. | 414/217 |
| 6,051,982 | A * | 4/2000 | Alcoe et al. | 324/754 |
| 6,322,119 | B1 * | 11/2001 | Schmidt et al. | 294/103.1 |
| 6,450,750 | B1 * | 9/2002 | Heyder et al. | 414/217 |
| 6,467,827 | B1 * | 10/2002 | Ardezzone | 294/119.3 |
| 6,537,011 | B1 * | 3/2003 | Wang et al. | 414/217 |
| 6,634,686 | B2 * | 10/2003 | Hosokawa | 294/213 |
| 6,688,375 | B1 * | 2/2004 | Turner et al. | 165/48.1 |
| 6,729,824 | B2 * | 5/2004 | Lei et al. | 414/217 |
| 6,914,337 | B2 | 7/2005 | Chuang et al. | |
| 6,917,755 | B2 * | 7/2005 | Nguyen et al. | 392/418 |
| 7,048,316 | B1 * | 5/2006 | Blank et al. | 294/213 |
| 2002/0034886 | A1 * | 3/2002 | Kurita et al. | 438/800 |
| 2002/0071756 | A1 * | 6/2002 | Gonzalez | 414/941 |
| 2003/0044261 | A1 * | 3/2003 | Bonora et al. | 414/217.1 |

(Continued)

*Primary Examiner* — Saul Rodriguez
*Assistant Examiner* — Glenn Myers
(74) *Attorney, Agent, or Firm* — Ishimaru & Associates LLP

(57) ABSTRACT

A wafer handling system includes providing a loadlock tray assembly having a plurality of vertically-stacked loadlock trays; and mounting nipples around each of the plurality of vertically-stacked loadlock trays for supporting a plurality of wafers, each of the nipple having a flat top.

20 Claims, 6 Drawing Sheets

(56) References Cited

U.S. PATENT DOCUMENTS

| | | |
|---|---|---|
| 2003/0205905 A1 | 11/2003 | Chen et al. |
| 2004/0045502 A1* | 3/2004 | Yokoyama et al. ............ 118/429 |
| 2004/0113444 A1* | 6/2004 | Blonigan et al. ................ 294/1.1 |
| 2004/0216672 A1* | 11/2004 | Ishii et al. ..................... 118/719 |
| 2005/0006916 A1* | 1/2005 | Mantz ........................ 294/103.1 |
| 2005/0095088 A1* | 5/2005 | Kurita et al. .................. 414/217 |
| 2005/0095111 A1 | 5/2005 | Kim et al. |
| 2006/0013674 A1* | 1/2006 | Elliott et al. ............. 414/222.01 |
| 2006/0196422 A1* | 9/2006 | Hiroki .......................... 118/719 |
| 2007/0151515 A1* | 7/2007 | Kim ............................. 118/719 |

* cited by examiner

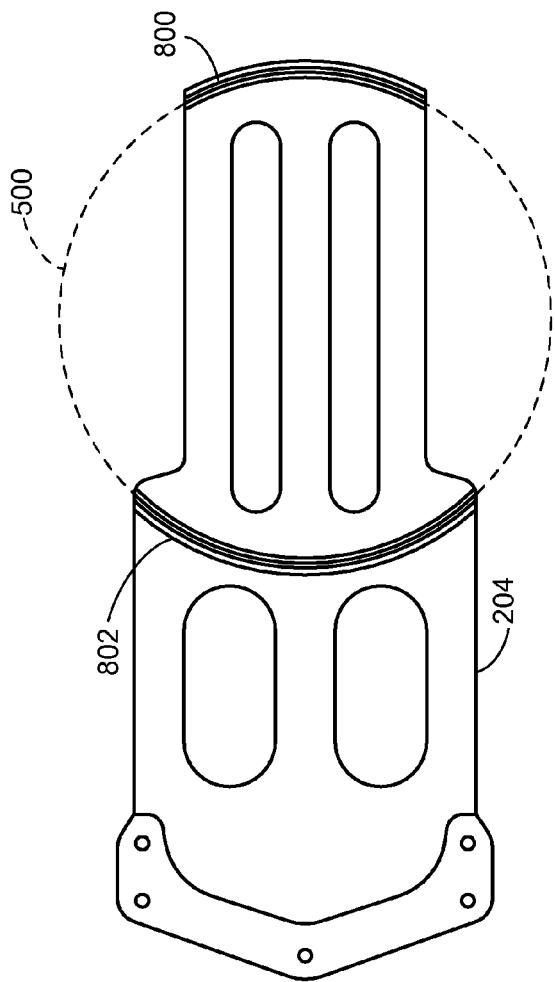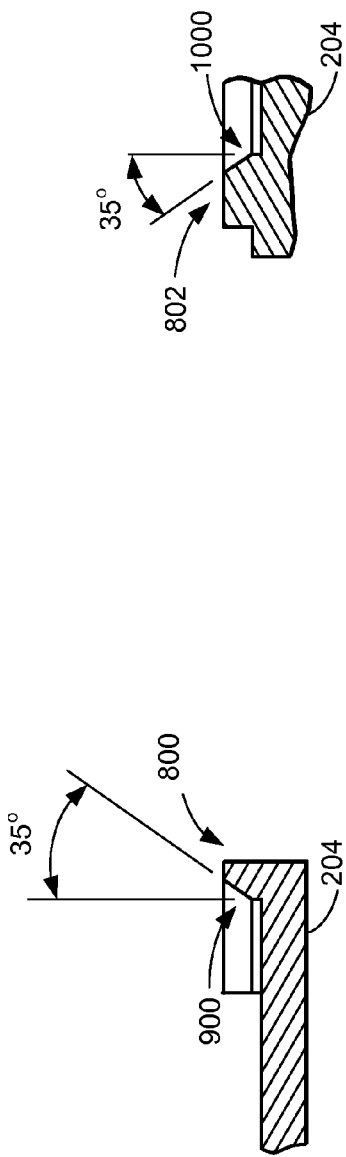
FIG. 8
FIG. 9
FIG. 10

1100

PROVIDING A LOADLOCK TRAY ASSEMBLY HAVING A PLURALITY OF VERTICALLY-STACKED LOADLOCK TRAYS
1102

MOUNTING NIPPLES AROUND EACH OF THE PLURALITY OF VERTICALLY-STACKED LOADLOCK TRAYS FOR SUPPORTING A PLURALITY OF WAFERS, EACH OF THE NIPPLES HAVING A FLAT TOP
1104

FIG. 11

WAFER HANDLING SYSTEM FOR A LOADLOCK

CROSS-REFERENCE TO RELATED APPLICATION(S)

This application claims the benefit of U.S. Provisional application No. 60/864,148 filed Nov. 2, 2006.

TECHNICAL FIELD

The present invention relates generally to semiconductor manufacturing, and more particularly to a system for handling wafer movement and centering during movement between processing devices.

BACKGROUND ART

As wafers transfer from station to station in a semiconductor manufacturing system, tolerance stack-up as well as handling problems, such as ESC sticking, result in wafer offset that causes process shift, which may ultimately lead to wafer loss. It is therefore desirable for the transfer robot to measure wafer offset and correct this offset at each station transfer.

Typically, multiple sensors are required to empirically and analytically derive the wafer center position. Sensors can be activated upon wafer movement, and a plurality of sensors can be used to determine the wafer's exact position in a station at a given moment. In one system, a robotic handling system is taught using an array of sensors positioned generally transverse to the path of movement of a substrate to detect the relative positions of the substrate for the purpose of precisely aligning the substrate relative to a predetermined destination point. In this system, a minimum of two sensors is required.

In another system, an apparatus, separate and apart from the processing system, utilizes a "spindle" type method where the wafer is incrementally rotated. This system does not take advantage of the direct movement of the wafer as it is transferred from the wafer storage cassette.

Another system requires an array of optical sensors positioned generally transverse to the linear path of the wafer support blade. Moreover, the wafer must pass over the sensors in a linear path transverse to the position of the sensors, which are positioned adjacent to the loadlock chamber. This makes this system ill suited to multiple chamber wafer processing systems.

In all these systems, multiple sensors are used to locate the wafer in-situ while the wafer is being transferred to or placed within a station. With multiple sensors in an array, each algorithm employed necessarily requires multiple sensor activation information, which is ultimately converted into multiple location coordinate points.

Thus, a need still remains for improved wafer handling systems. Further, wafer handling systems for loadlock chambers for loading and locking processing equipment, which require wafer cooling, are required. In view of the ever-increasing commercial competitive pressures, along with growing consumer expectations and the diminishing opportunities for meaningful product differentiation in the marketplace, it is critical that answers be found for these problems. Additionally, the need to save costs, improve efficiencies and performance, and meet competitive pressures, adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a wafer handling system including: providing a loadlock tray assembly having a plurality of vertically-stacked loadlock trays; and mounting nipples around each of the plurality of vertically-stacked loadlock trays for supporting a plurality of wafers, each of the nipples having a flat top.

Certain embodiments of the invention have other aspects in addition to or in place of those mentioned above. The aspects will become apparent to those skilled in the art from a reading of the following detailed description when taken with reference to the accompanying drawings.

BRIEF DESCRIPTION OF THE DRAWINGS

FIG. 8 is a plan view of the robot blade;

FIGS. 9 and 10 are the front shoe and the back shoe of the robot blade in accordance with an embodiment of the present invention; and FIG. 11 is a flow chart of a wafer handling system, for manufacturing a wafer handling system, in an embodiment of the present invention.

BEST MODE FOR CARRYING OUT THE INVENTION

Figure 1:
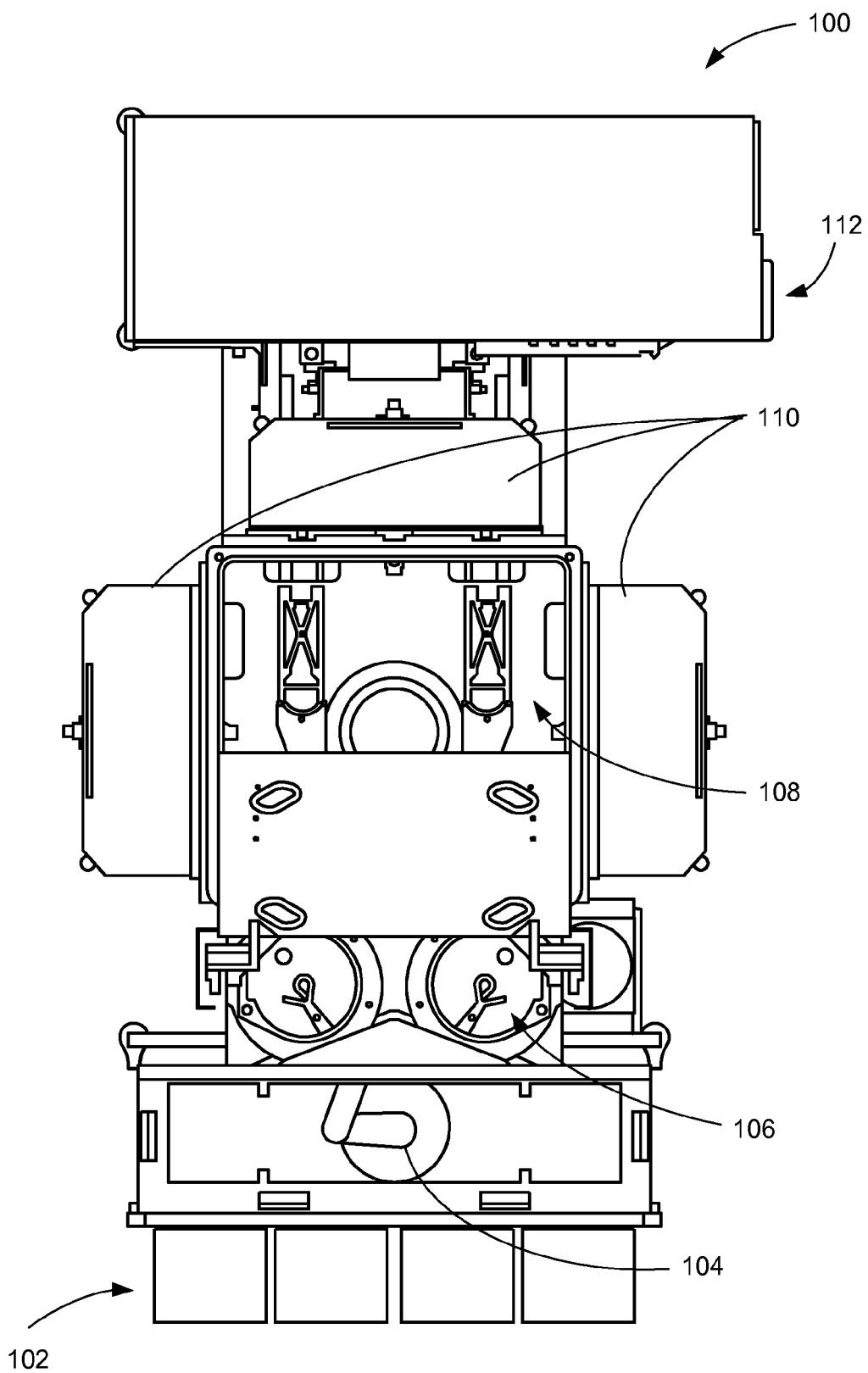
FIG. 1 is a plan view of a semiconductor wafer processing and handling system.

The following embodiments are described in sufficient detail to enable those skilled in the art to make and use the invention. It is to be understood that other embodiments would be evident based on the present disclosure, and that process or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGS. Where multiple embodiments are disclosed and described, having some features in common, for clarity and ease of illustration, description, and comprehension thereof, similar and like features one to another will ordinarily be described with like reference numerals.

For expository purposes, the term "horizontal" as used herein is defined as a plane parallel to the plane or surface of the auto-align blade, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "system" means the method and the apparatus of the present invention, as would be evident from context. The term "processing" as used herein includes stamping, forging, patterning, exposure, development, etching, cleaning, and/or removal of the material or laser trimming as required in forming a described structure.

Referring now to FIG. 1, therein is shown a plan view of a semiconductor wafer processing and handling system 100, which includes a cassette load station 102, a front robot 104, a loadlock chamber 106, a central transfer chamber 108, one or more processing chambers or heater chambers 110, and control towers and gas chamber 112.

The loadlock chamber 106 is provided for transferring wafers between the central transfer chamber 108, which is typically at high vacuum, and the outside, typically a clean room at atmospheric pressure. The central transfer chamber 108 is provided with a vacuum transfer robot located therein for transferring wafers between the loadlock chamber 106 and/or the heater chambers 110, which, are located about the periphery of the central transfer chamber 108.

The loadlock chamber 106 includes a left loadlock and a right loadlock. Each loadlock has six loadlock trays for transfer of wafers from the cassette load station 102 (atmospheric side) and transfer chamber 108 (vacuum side).

The wafers are loaded/unloaded by both a vacuum robot and an atmospheric robot. The vacuum robot in the central transfer chamber 108 passes wafers through slit valves in the processing chambers 110 and/or the heater chamber 110 and retrieves them after processing in the chambers is complete.

Access between the processing chambers 110 and between the central transfer chamber 108 and the loadlock chamber 106 is via vertical-motion type slit valves which selectively isolate the processing chambers 110 or heat chamber 110 from the robot (in the central transfer chamber 108) and the robot from the loadlock chamber 106. However, the loadlock chamber 106 at the atmospheric side may have other than flip door type slit valves. Other doors may also be used to separate the vacuum condition in the loadlock chamber 106 from the atmospheric conditions outside the loadlock chamber 106.

Figure 2:
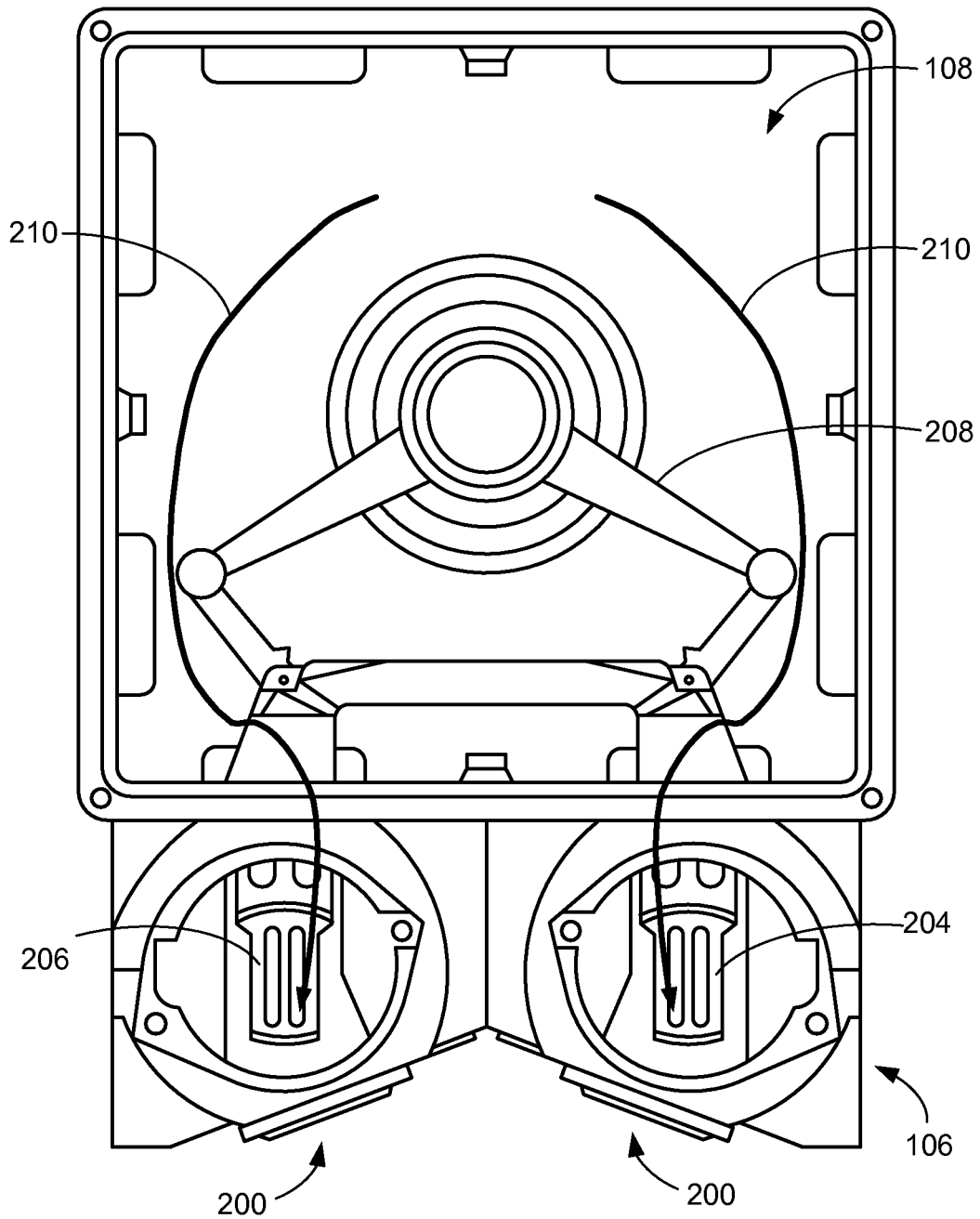
FIG. 2 is a plan view of a central transfer chamber and the loadlock chamber.

Referring now to FIG. 2, therein is shown a plan view of a central transfer chamber 108 and the loadlock chamber 106. The loadlock chamber 106 has two loadlocks 200 and 202 respectively containing robot blades 204 and 206 in accordance with an embodiment of the present invention.

The robot blades 204 and 206 are on a vacuum robot 208, which carries the wafers during transfers between the central transfer chamber 108 and the loadlocks 200 and 202. The central transfer chamber 108 is purged with an inert gas 210, such as 350 sccm of $N_2$ gas, so that central transfer chamber pressure is always higher than loadlock pressure during wafer transfer to avoid cross-contamination. The transfer of the wafers from the loadlocks 200 and 202 to the central transfer chamber 108 is performed under vacuum conditions.

Figure 3:
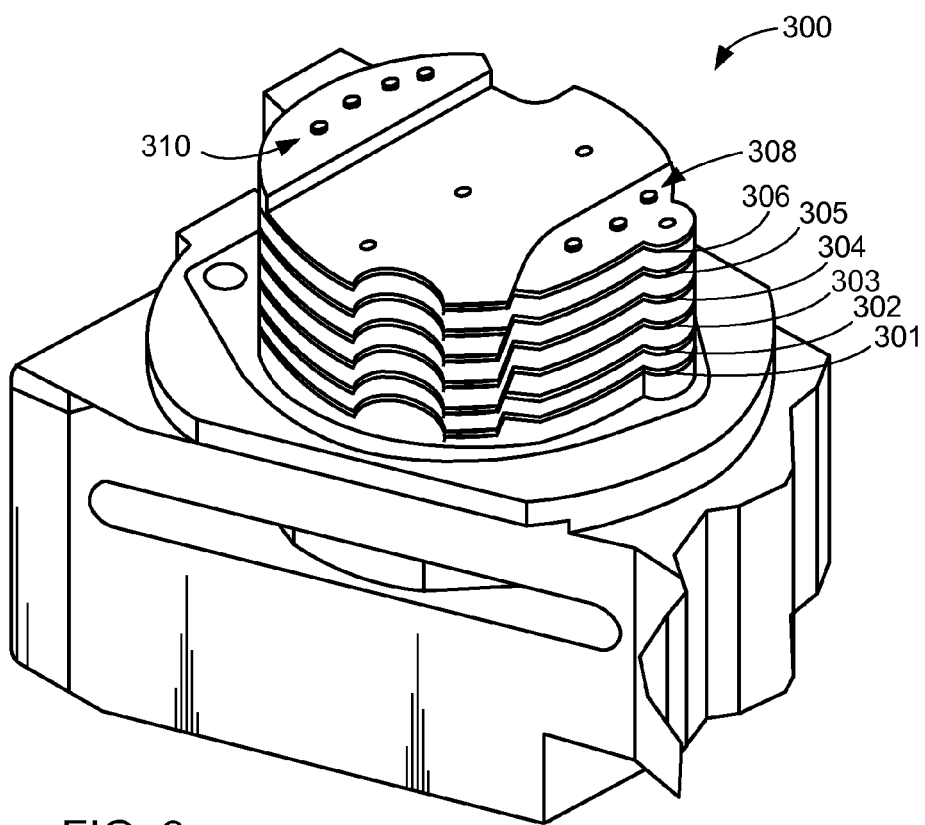
FIG. 3 is an isometric view of a loadlock tray assembly.

Referring now to FIG. 3, therein is shown an isometric view of a loadlock tray assembly 300. The loadlock tray assembly 300 is made up of vertically-stacked, individual wafer trays 301 through 306, stacked on top of each other with each capable of supporting one wafer.

Each wafer tray, such as the wafer tray 301, has nipples 308 on one side and nipples 310 on the other side, generally made of ceramic, to support a wafer to reduce backside contamination and enhance loadlock cooling.

Figure 4:
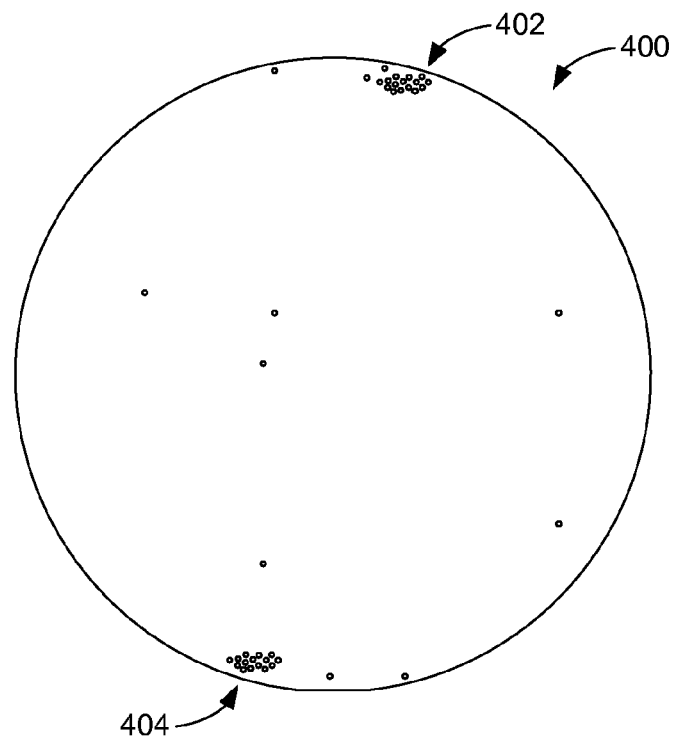
FIG. 4 is a wafer having particle streak defects.

Referring now to FIG. 4, therein is shown a wafer 400 having particle streak defects 402 and 404. The particle streak defects 402 and 404 were intermittent so their sources were previously unknown and difficult to detect.

After investigation, it was discovered that the particle streak defects 402 and 404 were due to wafer edges rubbing against the nipples 308 and 310 of FIG. 3 due to pressure turbulence caused by the increased central transfer chamber pressure of 200 mT compared to 5 mT during wafer transfer. This caused small particles to break-off from the wafers at random intervals. The problem was most severe, when it occurred, on the top wafer on the wafer tray 306.

The investigation in particular, showed that the top wafer on the wafer tray 306 moved slightly during the loadlock pump down and the wafer movement caused rubbing against centering pins on top of the nipples 308 and 310 creating additional particles.

Also, it appeared that turbulence of pressure from the central transfer chamber 108 of FIG. 1 into the loadlock 200 during interconnection of the chambers caused further rubbing.

Figure 5:
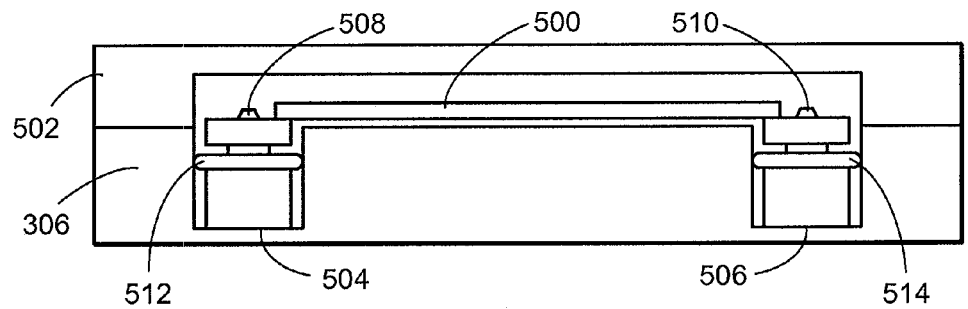
FIG. 5 is a partial cross-section of the wafer tray with a wafer.

Referring now to FIG. 5, therein is shown a partial cross-section of the wafer tray 306 with a wafer 500. In an alternate embodiment, it was discovered that another way of preventing the particle streak defects 402 and 404 of FIG. 4 was by placing a protective umbrella 502 over the wafer tray 306, which is a top loadlock tray 306 of the loadlock tray assembly 300, of FIG. 3. The umbrella 502 has a plan view configuration that would look just like the plan view configuration of the wafer tray 306.

With the umbrella 502, the loadlock tray 306 has nipples 504 and 506 with centering pins 508 and 510, respectively. The nipples 504 and 506 are held in the wafer tray 306 by O-rings 512 and 514, respectively.

Figure 6:
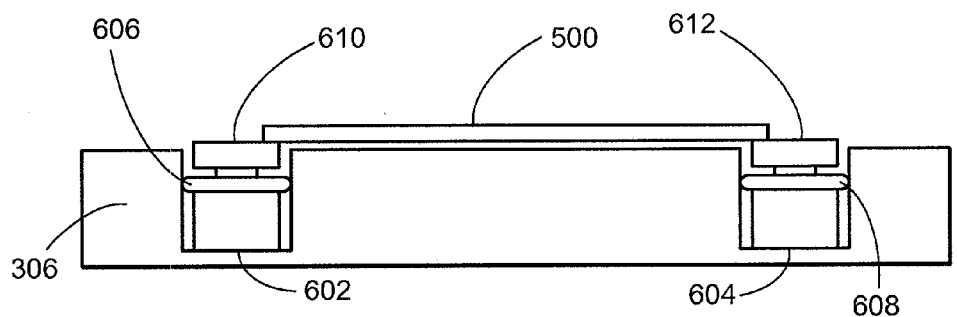
FIG. 6 is a partial cross-section of the wafer tray with the wafer resting on nipples in accordance with an embodiment of the present invention.

Referring now to FIG. 6, therein is shown a partial cross-section of the wafer tray 306 with the wafer 500 resting on nipples 602 and 604 in accordance with an embodiment of the present invention. The nipples 604 and 604 are embedded in opposite peripheries of the loadlock tray/wafer tray 306. The nipples 602 and 604 are held into the wafer tray 306 by O-rings 606 and 608, respectively.

After experimentation, it was discovered that the particle streak defects 402 and 404 of FIG. 4 could be reduced or eliminated by configuring the nipples 602 and 604 to have grooved tops 610 and 612 so there were no pins, such as the centering pins 508 and 510 of FIG. 5, to rub against.

Figure 7:
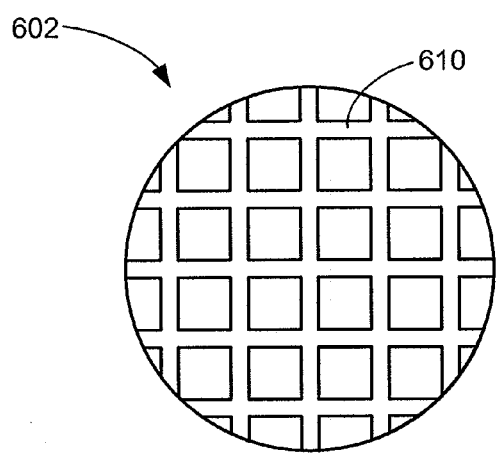
FIG. 7 is a plan view of the nipple with the flat, rough top.

Referring now to FIG. 7, therein is shown a plan view of the nipple 602 with the grooved top 610. The grooved top 610 has a flat portion with no projections. It was discovered that a grid pattern of grooves 612 would provide the grooved top 610 on the nipples 602 and 604 of FIG. 6 with sufficiently large flat portions between the grooves 612 to hold the wafer 500 without causing the particle streak defects 402 of FIG. 4 in the presence of turbulence.

In one embodiment, it has been discovered that a grid pattern of grooves that are 0.75 mm+/−0.05 mm in width and 0.75 mm+/−0.05 mm in depth provides the optimum combination of holding effect and particle streak defect elimination. The grid pattern of grooves are configured in an array of squares. The grooves are spaced 1.8+/−0.1 mm apart, centerline to centerline.

Referring now to FIG. 8, therein is shown a plan view of the robot blade 204.

After some experimentation, it was found that, while the flat tops 610 and 612 of FIG. 6 would hold the wafer 500, the wafer 500 would sometimes not be centered on the nipples 602 and 604.

The robot blade 204 has a front shoe 800 and a back shoe 802 for holding the wafer 500 (shown in dotted outline for clarity).

Referring now to FIGS. 9 and 10, therein are shown the front shoe 800 and the back shoe 802 of the robot blade 204 of FIG. 2 in accordance with an embodiment of the present invention. It has been discovered that, by placing internal front and back chamfers 900 and 1000, respectively, of about 35 degrees plus or minus 2 degrees, and a very low surface roughness of 0.35 um with a fine metallic finish, defined a as a polished nickel or chrome plating, an effective auto-centering capability is obtained for centering the wafer 500 on the nipples 602 and 604 of FIG. 6. The chamfer of about 35 degrees allows for the maximum play of the wafer in the robot blade 204 while compensating for variations in repeatability of the vacuum robot 208.

It has further been discovered that the internal back chamfer 1000 is more important than the internal front chamfer 900, which can have a rounded configuration.

Referring now to FIG. 11, therein is shown a flow chart of a wafer handling system 1100, for manufacturing a wafer handling system 100, in an embodiment of the present invention. The system 1100 includes: providing a loadlock tray assembly having a plurality of vertically-stacked loadlock trays in a block 1102; and mounting nipples around each of the plurality of vertically-stacked loadlock trays for supporting a plurality of wafers, each of the nipples having a flat top in a block 1104.

A principle aspect that has been unexpectedly discovered is that the present invention provides a reduction in defects while increasing the throughput of the wafer processing system.

Another aspect is the present invention improves manufacturing yield

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the wafer handling system for loadlock cooling of the present invention furnishes important and heretofore unknown and unavailable solutions, capabilities, and functional aspects for integrated circuit manufacturing and wafer handling. The resulting processes and configurations are straightforward, cost-effective, uncomplicated, highly versatile and effective, can be surprisingly and unobviously implemented by adapting known technologies, and are thus readily suited for efficiently and economically manufacturing integrated circuit devices fully compatible with conventional manufacturing processes and technologies.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of a wafer handling system comprising:
   providing a loadlock tray assembly having a plurality of vertically-stacked loadlock trays; and
   embedding nipples in opposite peripheries of each of the plurality of vertically-stacked loadlock trays for supporting a plurality of wafers, each of the nipples having a grooved top, and the grooved top includes a grid pattern of squares having a flat portion with no projections for holding wafers without causing particle streak defects, the grid pattern includes grooves, the grooves are 0.75 mm wide and 0.75 mm in depth.

2. The method as claimed in claim 1 further comprising:
   providing a vacuum robot for transferring wafers to and from the loadlock tray assembly; and
   attaching a robot blade on the vacuum robot for centering wafers on the nipples.

3. The method as claimed in claim 1 further comprising:
   providing a vacuum robot for transferring wafers to and from the loadlock tray assembly; and
   attaching a robot blade on the vacuum robot for centering wafers on the nipples, the robot blade having a fine metallic finish and front and back shoes with internal chamfers of about 35 degrees for carrying the wafers.

4. The method as claimed in claim 1 further comprising attaching an umbrella over the top loadlock tray of the loadlock tray assembly.

5. The method as claimed in claim 1 further comprising attaching an umbrella over the top loadlock tray of the loadlock tray assembly, the umbrella having a plan view configuration like the plan view configuration of the top loadlock tray.

6. A method of manufacture of a wafer handling system comprising:
   providing a loadlock tray assembly having a plurality of vertically-stacked loadlock trays; and
   embedding nipples in opposite peripheries of each of the plurality of vertically-stacked loadlock trays for supporting a plurality of wafers, each of the nipples having a grooved top with grooves 0.75 mm plus or minus 0.05 mm in width and the grooves 0.75 mm plus or minus 0.05 mm in depth provided therein, and the grooved top includes a grid pattern of squares having a flat portion with no projections for holding wafers without causing particle streak defects.

7. The method as claimed in claim 6 further comprising:
   providing a vacuum robot for transferring wafers to and from the loadlock tray assembly; and
   attaching a robot blade on the vacuum robot for centering wafers on the nipples.

8. The method as claimed in claim 6 wherein:
   embedding the nipples include providing each of the nipples with the grooved top having the grid pattern of the grooves provided therein; and
   further comprising:
   providing a vacuum robot for transferring wafers to and from the loadlock tray assembly; and
   attaching a robot blade on the vacuum robot for centering wafers on the nipples, the robot blade having a fine metallic finish and front and back shoes with internal chamfers of 35 degrees plus or minus 2 degrees for carrying the wafers.

9. The method as claimed in claim 6 further comprising attaching an umbrella on the top loadlock tray of the loadlock tray assembly.

10. The method as claimed in claim 6 further comprising attaching an umbrella on the top loadlock tray of the loadlock tray assembly, the umbrella having a plan view configuration like the plan view configuration'of the top loadlock tray.

11. A wafer handling system comprising:
 a loadlock tray assembly having a plurality of vertically-stacked loadlock trays; and
 nipples embedded on opposite peripheries of each of the plurality of vertically-stacked loadlock trays for supporting a plurality of wafers, each of the nipples having a grooved top, the grooved top includes a grid pattern of squares having a flat portion with no projections for holding wafers without causing particle streak defects, the grid pattern includes grooves, the grooves are 0.75 mm wide and 0.75 mm in depth.

12. The system as claimed in claim 11 further comprising:
 a vacuum robot for transferring wafers to and from the loadlock tray assembly; and
 a robot blade on the vacuum robot for centering wafers on the nipples.

13. The system as claimed in claim 11 further comprising:
 a vacuum robot for transferring wafers to and from the loadlock tray assembly; and
 a robot blade on the vacuum robot for centering wafers on the nipples, the robot blade having a fine metallic finish and front and back shoes with internal chamfers of about 35 degrees for carrying the wafers.

14. The system as claimed in claim 11 further comprising an umbrella attached over the top loadlock tray of the loadlock tray assembly.

15. The system as claimed in claim 11 further comprising an umbrella attached over the top loadlock tray of the loadlock tray assembly, the umbrella having a plan view configuration like the plan view configuration of the top loadlock tray.

16. A wafer handling system comprising:
 a loadlock tray assembly having a plurality of vertically-stacked loadlock trays; and
 nipples embedded on opposite peripheries of each of the plurality of vertically-stacked loadlock trays for supporting a plurality of wafers, each of the nipples having a grooved top having grooves 0.75 mm plus or minus 0.05 mm in width and the grooves 0.75mm plus or minus 0.05 mm in depth provided therein, the grooved top includes a grid pattern of squares having a flat portion with no projections for holding wafers without causing particle streak defects.

17. The system as claimed in claim 16 further comprising:
 a vacuum robot for transferring wafers to and from the loadlock tray assembly; and
 a robot blade attached on the vacuum robot for centering wafers on the nipples.

18. The system as claimed in claim 16 further comprising:
 a vacuum robot for transferring wafers to and from the loadlock tray assembly; and
 a robot blade attached on the vacuum robot for centering wafers on the nipples, the robot blade having a fine metallic finish and front and back shoes with internal chamfers of 35 degrees plus or minus 2 degrees for carrying the wafers.

19. The system as claimed in claim 16 further comprising an umbrella attached on the top loadlock tray of the loadlock tray assembly.

20. The system as claimed in claim 16 further comprising an umbrella attached on the top loadlock tray of the loadlock tray assembly, the umbrella having a plan view configuration like the plan view configuration of the top loadlock tray.

* * * * *